(12) United States Patent
Tseng et al.

(10) Patent No.: US 6,967,145 B2
(45) Date of Patent: Nov. 22, 2005

(54) METHOD OF MAINTAINING PHOTOLITHOGRAPHIC PRECISION ALIGNMENT AFTER WAFER BONDING PROCESS

(75) Inventors: Chung-Yang Tseng, Taipei (TW); Shih-Chin Gong, Taipei (TW); Reuy-shing Huang, Chiai Hsien (TW); Tong-An Lee, Pantao (TW); Kuo-Chung Chan, Hsinchu (TW); Hung-Dar Wang, Kaosiung (TW)

(73) Assignee: Asia Pacific Microsystems, Inc., Hsinchu (TW)

( * ) Notice: Subject to any disclaimer, the term of this patent is extended or adjusted under 35 U.S.C. 154(b) by 66 days.

(21) Appl. No.: 10/722,603

(22) Filed: Nov. 28, 2003

(65) Prior Publication Data

US 2005/0013019 A1    Jan. 20, 2005

(30) Foreign Application Priority Data

Jul. 18, 2003   (TW) .............................. 92119717 A

(51) Int. Cl.$^7$ ............................................. H01L 21/76
(52) U.S. Cl. ..................... 438/401; 438/53; 438/456; 438/459; 438/462; 438/928; 438/975; 438/977; 257/E23.197
(58) Field of Search ........................... 438/52–53, 401, 438/406, 455–456, 462, 928, 975, 977, 459; 257/E23.197

(56) References Cited

U.S. PATENT DOCUMENTS

| | | | | |
|---|---|---|---|---|
| 5,236,118 A | * | 8/1993 | Bower et al. ............... | 228/193 |
| 5,632,854 A | * | 5/1997 | Mirza et al. ................. | 438/53 |
| 5,759,870 A | * | 6/1998 | Yun et al. .................... | 438/53 |
| 6,038,928 A | * | 3/2000 | Maluf et al. ................. | 73/724 |
| 6,388,297 B1 | * | 5/2002 | Talwar et al. ............... | 257/396 |
| 2003/0092244 A1 | * | 5/2003 | Oi et al. ...................... | 438/455 |

* cited by examiner

Primary Examiner—George Fourson
Assistant Examiner—Thanh V. Pham
(74) Attorney, Agent, or Firm—Troxell Law Office, PLLC

(57) ABSTRACT

A method of maintaining photolithographic precision alignment for a wafer after being bonded, wherein two cavities are formed at the rear surface of a top wafer at the position corresponding to alignment marks made on a bottom wafer. The depth of both cavities is deeper than that of a final membrane structure. The top wafer is then bonded to the bottom wafer which already has alignment marks and a microstructure. This bonded wafer is annealed to intensify its bonding strength. After that, a thinning process is applied until the thickness of the top wafer is reduced to thinner than the cavity depth such that the alignment marks are emerged in the top wafer cavities thereby serving as alignment marks for any exposure equipment.

4 Claims, 4 Drawing Sheets

METHOD OF MAINTAINING PHOTOLITHOGRAPHIC PRECISION ALIGNMENT AFTER WAFER BONDING PROCESS

BACKGROUND OF THE INVENTION

1. Field of the Invention

The present invention relates to a method of maintaining photolithographic precision alignment for a wafer after it is bonded. The method is performed by etching two cavities on a top wafer at the position corresponding to an alignment marks made on a bottom wafer. Afterwards, the bonded top and bottom wafers are treated with high temperature annealing process and thinning process successively so as to form a membrane structured wafer until the alignment marks made on the bottom wafer is exposed thereby providing a means for aligning the circuit pattern formed on the membrane to the structure of the bottom wafer.

2. Description of the Prior Art

In a book issued by Petersen et. al. in 1988 "Silicon Fusion Bonding for Pressure Sensors." The book introduced a method of applying the wafer bonding process to fabrication techniques for a pressure sensor. It disclosed that a new membrane structured wafer can be obtained after bonding two wafers by means of the process of fusion bonding. In the book, the technology of photolithography is discussed in detail since the performance of this process will significantly affect the property and size of the device.

The instrumentation usable for exposure alignment in lithography can be generally divided in two categories, i.e. a printer and a stepper. The printer may be a contact type or a proximity type, the stepper is a projection type. The resolution of the former is in the range of several micrometer, on the other hand, that of the latter can be in the degree of sub-micrometer.

For some of the micro sensor devices, it is necessary to carry out the layout of circuit on a membrane structured wafer. The characteristic of the device will be better if the cavity of bottom wafer correspond with the device structure on the membrane. In general, there are two categories for alignment in a membrane structured wafer.

The first one is that the printer process is exclusively adopted in wafer photolithographic process since it is possible for double sides alignment to assure precise arrangement for components. However, it has the inherent disadvantages that the photo resolution is poorer than that of the stepper. The resolution in line width becomes more problematic as the size of the components is minimized. As the number of masks which uses the printer is increased, the alignment between layers loses precision resulting in degrading the performance of the device. The wider line width results in enlarging the device size and extravagating the production cost.

The second one is fabrication of wafer structure before bonding is carried out by the stepper, on the successive procedures after the wafer is bonded are left to the printer. However, during printing, the shortcomings of dissatisfactory alignment precision between layers and a broader line width stated above remain the same.

Meanwhile, for any micro sensor device which is fabricated by means of wafer bonding technique, the two face alignment capability is necessary to compensate the inherent shortcoming of its exposure alignment equipment. For this reason, the successive photolithographic process shall only depend on a printer which has two face alignment capability to perform. Two types of techniques mentioned above which are applicable for the successive fabrication process will be:

1) The wafer bonding technique provided by Kurt Petersen et. al. in which the wet etching is utilized after the thinning process is completed for a bonded wafer so as to fabricate a pressure sensor device after the printer is employed to align the top and the bottom structures of the bonding wafer. As shown in FIG. 1, Nadim I. Naluf presented a method in U.S. Pat. No. 6,038,928 for modification of Kurt Petersen et. al.'s pressure sensor structure. At first, a cavity 12 is formed on a bottom wafer 11 by anisotropic etching process, and then the bottom wafer 11 is bonded with a top wafer 13. Next, the bonded wafer is ground to form a membrane structure. Finally, the backside of the bonded wafer is etched by anisotropic etching process.

2) In U.S. Pat. No. 5,632,854, Andy Nirza et. al. disclosed a method of fabricating a piezoresistive pressure sensor device in which the wet etching is replaced by the dry etching, but a printer is used in aligning a cavity 21 with the structure of device 22 formed on the membrane.

It should be pointed out that the above two alignment ways are insufficient to satisfy the high standard requirement for the device to have excellent characteristics with a minimized size. The main reason lies in the fact that the printer which is able to serve for double sides aligning of the wafer has a poor layer to layer alignment precision and reduced line width resolution compared to that of the stepper, on the other hand, the stepper which has better capability for alignment and superior line width resolution is unable to make double side alignment.

In view of this, the present invention provides a newly developed process which can do without the double side alignment capability after the wafer is bonded and grounded, yet the top and the bottom structures of a wafer still can be aligned.

SUMMARY OF THE INVENTION

It is an object of the present invention to provide a method of maintaining photolithographic precision alignment for a wafer after it is bonded. The method is performed by etching two cavities on the top wafer at the position corresponding to an alignment marks made on the bottom wafer, afterwards the bonded the top and the bottom wafers are treated with high temperature annealing process and thinning process by grinding the top wafer so as to form a membrane of wafer structure until the alignment marks made on the bottom wafer is exposed. Since the photolithographic process is carried out for both top and bottom wafer structure with respect to this alignment marks so that the exposure alignment equipment does not need double sides alignment capability for performing photolithography.

It is another object of the present invention to provide a method of maintaining photolithographic precision alignment for a wafer after being bonded that the alignment marks made on the bottom wafer can be exposed easily from the slot of the top wafer so as to upgrade the alignment precision between the top and the bottom wafers.

It is one more object of the present invention to provide a method of maintaining photolithographic precision alignment for a wafer after being bonded that by means of easily exposing this alignment marks from the cavities of the top wafer so as to provide a suspension membrane element for aligning a top structure with a bottom structure of devices such as a pressure sensor, an angular rate sensor, an acceleration sensor, an infrared detector, and a thin film resonator for an exposure equipment without double sides alignment capability.

DETAILED DESCRIPTION OF THE PREFERRED EMBODIMENTS

Figure 1:
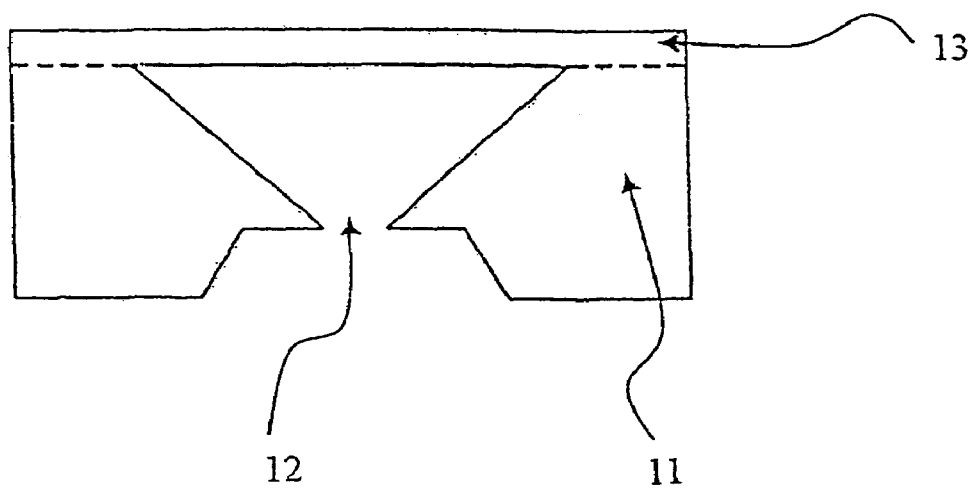
FIG. 1 is a schematic view of a pressure sensor structure fabricated according to the conventional wafer bonding technique.
Figure 2:
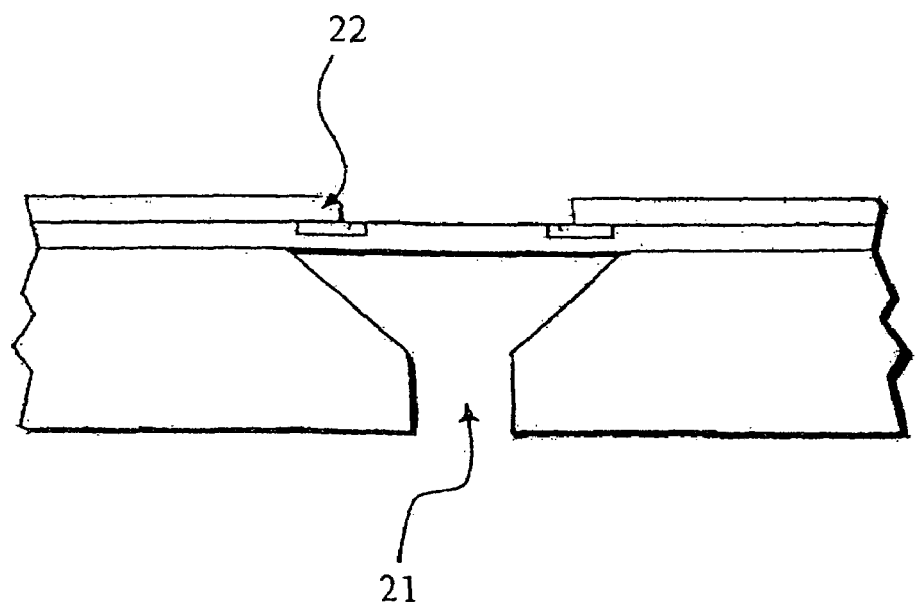
FIG. 2 is a schematic view of another pressure sensor structure fabricated according to the conventional wafer bonding technique.
Figure 3:
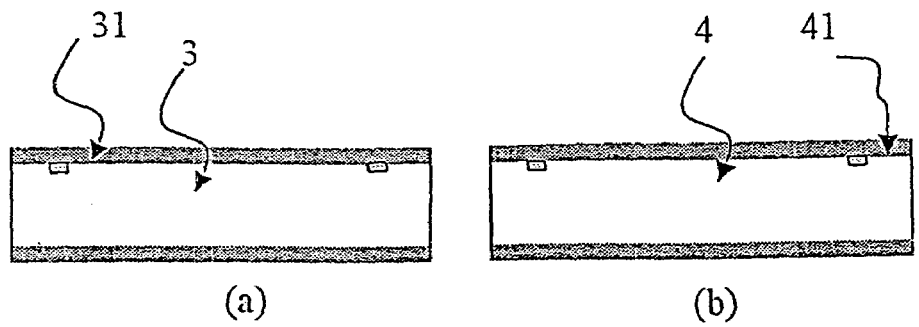
FIG. 3 through FIG. 10 are schematic views successively illustrating step 1 to step 8 of the method according to the present invention.
Figure 4:
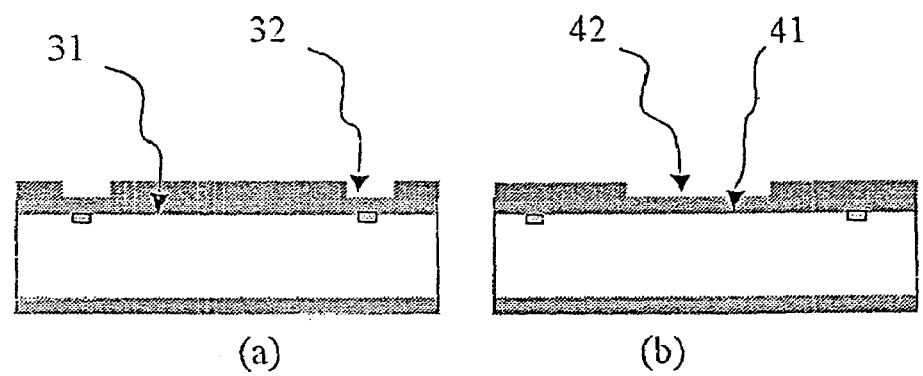
Figure 5:
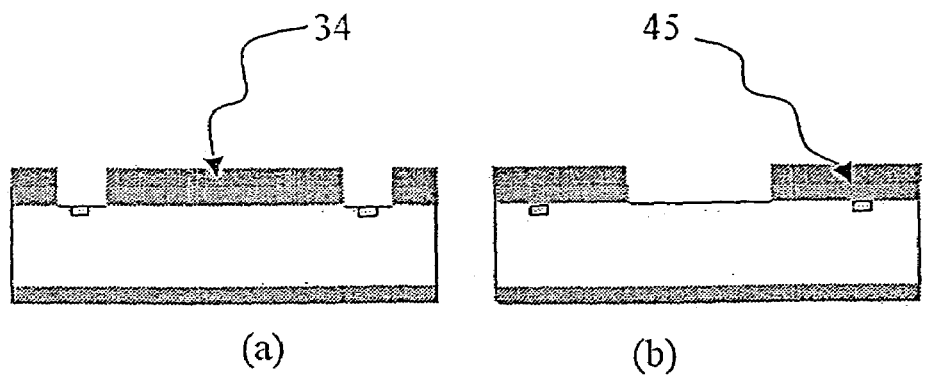
Figure 6:
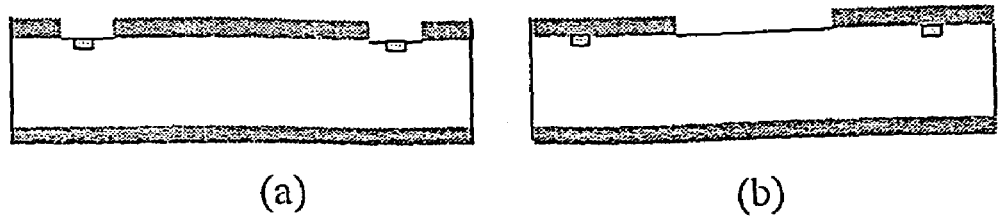
Figure 7:
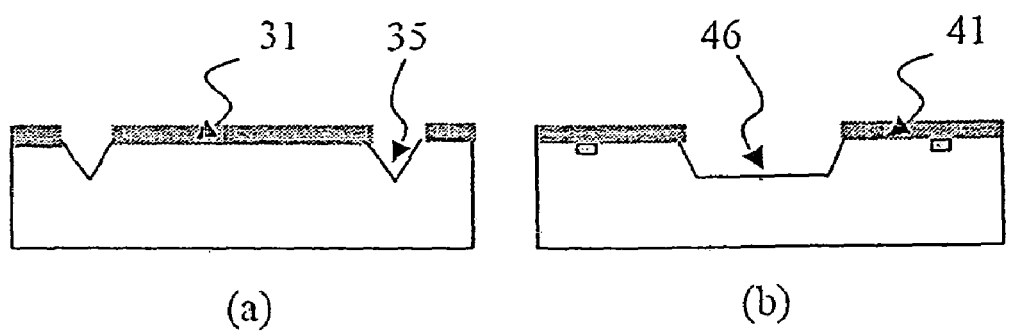
Figure 8:
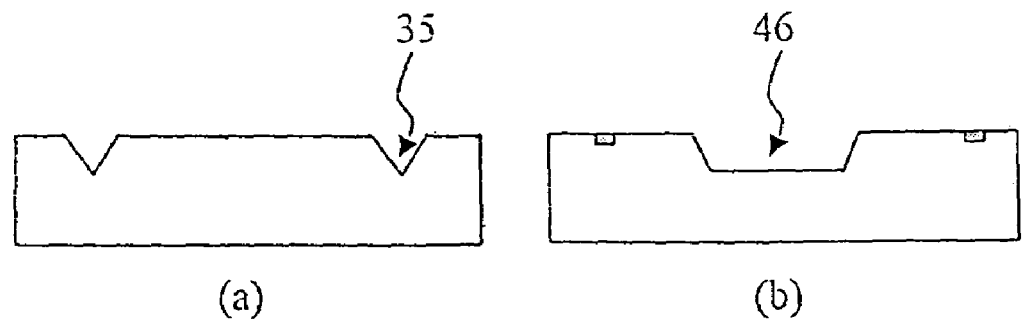
Figure 9:
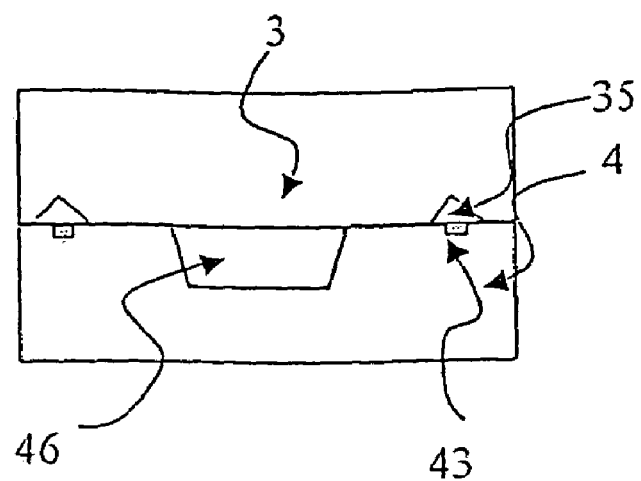

The method of maintaining photolithographic precision alignment for a wafer after it is bonded comprises the following steps:
1. Epitaxially growing $SiO_2$ or $Si_3N_4$ protective layers 31 and 41 respectively on a top and a bottom wafers 3 and 4 (see FIG. 3).
2. Forming patterns 32, 42 to be etched respectively on the protective layers 31 of the top wafer and the protective layer 41 of the bottom wafer by photolithography, the top pattern shall be corresponding to bottom one, and forming a microstructure on the bottom wafer with respect to the alignment marks 43 (see FIG. 4.)
3. Removing the protective layers 31 and 41 beneath the top wafer pattern and bottom wafer pattern by either dry or wet etching (see FIG. 5.)
4. Removing front surface photoresist 34 and 45. (See FIGS. 5 and 6.)
5. Forming cavities 35 and 46 on the respective patterns by wet etching (See FIG. 7.)
6. Removing the protective layers 31 and 41 (See FIGS. 7, 8.)
7. After bonding the top and the bottom wafers 3 and 4 by bonding the two patterned surfaces, setting the bonded wafer in the furnace for annealing so as to obtain a high degree linking (See FIG. 9.)
8. Carrying out the thinning process for the annealed wafer until the thickness of the top wafer 3 is reduced to the desired value (See FIG. 10.)
9. Exposing an alignment marks on the thinned wafer for successive photolithographic process using an exposing alignment equipment applicable for devices such as a pressure sensor, an angular rate sensor, an acceleration sensor, an infrared detector, and a thin film resonator.

EXAMPLE

Figure 10:
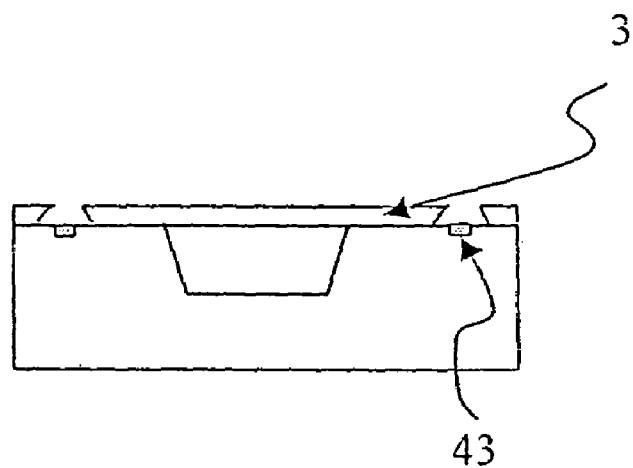

Now, by taking a pressure sensor for example, a n-type silicon wafer is used as a top wafer, while a p-type silicon wafer is used as a bottom wafer. A micro structure for the required cavity is formed on the bottom wafer. Two cavities are made by wet etching on the position corresponding to the alignment marks, and then the top and the bottom wafers are bonded by bonding the surface of the bottom wafer where the cavity is formed with the surface of the top wafer where the cavities are formed. The bonded wafer is then carried through the annealing treatment so as to ensure the bonding reliability. Finally the top wafer is thinned by grinding process to form a membrane with a desired thickness at the value ranging from several $\mu$m to ten times of several $\mu$m. The thickness of the membrane greatly affects the strength of output signal of a pressure sensor. As soon as the thickness of the membrane is reduced to less than the depth of the cavities formed on the bottom wafer, the alignment marks will be exposed out of the cavities as shown in FIG. 10 therefore the alignment marks can be used as an aim for the exposure alignment for the successive process.

As described above, in the fabrication process of the present invention, an exposure alignment equipment is employed to make out alignment marks on the surface of the bottom wafer, and a microstructure is formed thereon such as a cavity of a pressure sensor. Then two cavities are etched on the top wafer at the position corresponding to these marks, the thickness of the cavity depends on the actual requirement. After bonding the two wafers by bonding the surface of the bottom wafer where the microstructure is formed with the surface of the top wafer where the cavities are formed. The bonded wafer is then gone through the annealing treatment so as to become a uni-wafer with a high bond strength. Before annealing, there may exist some microvoids. As soon as the annealing temperature reaches up to 1000° C., the surface bonding of Si/Si, $Si/SiO_2$, or $SiO_2/SiO_2$ may be produced at the interface of the two wafers. After bonding, the top wafer is ground and buffed to form a thin film having a desired thickness until the alignment marks made on the bottom wafer is exposed.

The aforesaid wafer bonding techniques include two categories of intermediate bonding and non-intermediate bonding. The intermediate bonding methods include eutectic bonding, glass frit seal and organic intermediate bonding. The non-intermediate bonding include anodic bonding, fusion bonding, and direct bonding.

According to the above mentioned method, the stepper can find out the alignment marks for performing successive process including fabrication of a pressure sensor, an angular rate sensor, an acceleration sensor, an infrared detector, and a thin film resonator.

From the above description, the method of maintaining photolithographic precision alignment for a wafer after being bonded can firstly form two cavities on the top wafer at the position corresponding to an alignment marks made on the bottom wafer, and then the bonded wafer is put to go through the high temperature annealing. After being annealed, the top wafer is ground to reduce its thickness until the aforesaid alignment marks on the bottom wafer is exposed. In this way, the method according to the present invention is advantageous that its exposure aligning equipment is unnecessary to have two face alignment capability in performing photolithographic process, yet still can make a precise alignment between the upper and the lower wafers. The method of the present invention is well applicable for fabrication of a pressure sensor, an angular rate sensor, an acceleration sensor, and infrared detector, and a thin film resonator.

Those who are skilled in the art will readily perceive how to modify the invention. Therefore, the appended claims are to be construed to cover all equivalent structures which fall within the true scope and spirit of the invention.

What is claimed is:
1. A method of maintaining photolithographic precision alignment for a wafer after it is bonded comprising the steps:
   a. at first making an alignment mark on the surface of a bottom wafer and then a microstructure for a device on the same surface of the bottom wafer;

b. forming two cavities on the rear surface of a top wafer at the position corresponding to said alignment marks by an etching process;
c. applying grinding process to said top wafer after completion of bonding said top and said bottom wafers;
d. exposing said alignment marks made on said bottom wafer by said grinding said top wafer to reduce its thickness;
   by doing so, facilitating an exposure equipment to find out said alignment marks so as to carry out successive electrical circuit layout process.

2. The method as in claim 1, wherein said exposure equipment maintains precision of photolithographic alignment with respect to said alignment marks made on said bottom wafer.

3. The method as in claim 1, wherein said top and said bottom wafers are a n-type wafer and p-type wafer respectively.

4. The method of claim 1, wherein said cavities formed on said top wafer are performed by either wet or dry etching.

* * * * *